(12) United States Patent
Sinclair

(10) Patent No.: US 7,249,856 B2
(45) Date of Patent: Jul. 31, 2007

(54) ELECTROSTATIC BIMORPH ACTUATOR

(75) Inventor: Michael J. Sinclair, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 10/868,603

(22) Filed: Jun. 14, 2004

(65) Prior Publication Data

US 2004/0227428 A1 Nov. 18, 2004

Related U.S. Application Data

(63) Continuation of application No. 10/112,369, filed on Mar. 29, 2002.

(51) Int. Cl.
*G03B 21/28* (2006.01)
*G03B 21/00* (2006.01)
*G02F 1/00* (2006.01)
*G02B 26/00* (2006.01)

(52) U.S. Cl. ............................ 353/99; 353/33; 348/771; 359/291; 359/290

(58) Field of Classification Search ................ 353/102, 353/122, 99, 31, 33; 359/290, 212, 223, 224, 359/197, 198, 218, 291, 292, 871–874; 348/742, 348/743, 771
See application file for complete search history.

(56) References Cited

U.S. PATENT DOCUMENTS

| | | | |
|---|---|---|---|
| 3,071,036 A | 1/1963 | McKnight et al. | ............... 88/1 |
| 4,157,861 A | 6/1979 | Davies | ....................... 350/285 |

(Continued)

FOREIGN PATENT DOCUMENTS

| | | |
|---|---|---|
| EP | 0 774 681 A1 | 5/1997 |
| EP | 0 831 252 A2 | 3/1998 |
| EP | 0 778 657 B1 | 9/2001 |

(Continued)

OTHER PUBLICATIONS

Chang, C. et al., "Innovative Micromachined Microwave Switch with Very Low Insertion Loss", *Sensors and Actuators*, 2000, 71–75.

Chen, R.T. et al., "A Low Voltage Micromachined Optical Switch by Stress–Induced Bending", *Micro Electro Mechanical Systems*, 1999, 424–428, XP010321766.

Chiao, M. et al., "Self–Buckling of Micromachined Beams Under Resistive Heating", *Journal of Microelectromechanical Systems*, Mar. 2000, 9(1), 1057-7157.

(Continued)

*Primary Examiner*—Judy Nguyen
*Assistant Examiner*—Andrew Sever
(74) *Attorney, Agent, or Firm*—Woodcock Washburn LLP

(57) ABSTRACT

An electrostatic bimorph actuator includes a cantilevered flexible bimorph arm that is secured and insulated at one end to a planar substrate. In an electrostatically activated state the bimorph arm is generally parallel to the planar substrate. In a relaxed state, residual stress in the bimorph arm causes its free end to extend out-of-plane from the planar substrate. The actuator includes a substrate electrode that is secured to and insulated from the substrate and positioned under and in alignment with the bimorph arm. An electrical potential difference applied between the bimorph arm and the substrate electrode imparts electrostatic attraction between the bimorph arm and the substrate electrode to activate the actuator. As an exemplary application in which such actuators could be used, a microelectrical mechanical optical display system is described.

12 Claims, 10 Drawing Sheets

U.S. PATENT DOCUMENTS

| | | | |
|---|---|---|---|
| 4,421,381 A | 12/1983 | Ueda et al. ................. 350/285 |
| 5,061,914 A | 10/1991 | Busch et al. ................. 337/140 |
| 5,062,689 A | 11/1991 | Koehler ...................... 359/230 |
| 5,084,044 A | 1/1992 | Quint .......................... 606/27 |
| 5,099,352 A | 3/1992 | Yamamoto et al. ......... 359/213 |
| 5,257,977 A | 11/1993 | Eshel .......................... 604/113 |
| 5,276,545 A | 1/1994 | Daun et al. ................. 359/198 |
| 5,392,140 A | 2/1995 | Ezra et al. ..................... 359/41 |
| 5,455,706 A | 10/1995 | Brotz ........................... 359/198 |
| 5,469,291 A | 11/1995 | Plesko ......................... 359/224 |
| 5,481,396 A | 1/1996 | Ji et al. ....................... 359/295 |
| 5,496,271 A | 3/1996 | Burton et al. ................. 607/27 |
| 5,504,629 A | 4/1996 | Lim ............................. 359/850 |
| 5,543,956 A | 8/1996 | Nakagawa et al. ......... 359/225 |
| 5,549,557 A | 8/1996 | Steinke et al. .............. 604/103 |
| 5,612,736 A | 3/1997 | Vogeley et al. ........ 348/207.99 |
| 5,618,177 A | 4/1997 | Abbott ......................... 433/88 |
| 5,619,177 A | 4/1997 | Johnson et al. ............. 337/140 |
| 5,666,226 A | 9/1997 | Ezra et al. ................... 359/621 |
| 5,671,083 A | 9/1997 | Conner et al. .............. 359/291 |
| 5,688,239 A | 11/1997 | Walker ..................... 604/96.01 |
| 5,700,897 A | 12/1997 | Klainer et al. ................ 528/15 |
| 5,748,172 A | 5/1998 | Song et al. .................. 345/198 |
| 5,781,331 A | 7/1998 | Carr et al. ................... 359/288 |
| 5,784,189 A | 7/1998 | Bozler et al. ............... 359/254 |
| 5,870,007 A | 2/1999 | Carr et al. ................... 333/262 |
| 5,969,710 A | 10/1999 | Doherty et al. ............. 345/148 |
| 5,994,816 A | 11/1999 | Dhuler et al. ............... 310/307 |
| 6,023,121 A | 2/2000 | Dhuler et al. ............... 310/307 |
| 6,046,840 A * | 4/2000 | Huibers ....................... 359/291 |
| 6,108,118 A | 8/2000 | Minamoto ................... 359/224 |
| 6,122,089 A | 9/2000 | Minamoto et al. .......... 359/224 |
| 6,130,464 A | 10/2000 | Carr ............................. 257/417 |
| 6,137,623 A | 10/2000 | Roberson et al. ........... 359/291 |
| 6,188,504 B1 | 2/2001 | Murakami et al. .......... 359/224 |
| 6,220,730 B1 * | 4/2001 | Hewlett et al. .............. 362/297 |
| 6,229,684 B1 * | 5/2001 | Cowen et al. ............... 361/278 |
| 6,236,491 B1 * | 5/2001 | Goodwin-Johansson .... 359/291 |
| 6,246,504 B1 | 6/2001 | Hagelin et al. .............. 359/212 |
| 6,249,370 B1 | 6/2001 | Takeuchi et al. ............ 359/291 |
| 6,259,548 B1 | 7/2001 | Tsugai et al. ................ 359/224 |
| 6,275,325 B1 | 8/2001 | Sinclair ....................... 359/291 |
| 6,333,583 B1 | 12/2001 | Mahadevan et al. ........ 310/306 |
| 6,367,251 B1 | 4/2002 | Wood ........................... 60/528 |
| 6,422,011 B1 | 7/2002 | Sinclair ......................... 60/528 |
| 6,438,954 B1 | 8/2002 | Goetz et al. ................... 60/527 |
| 6,531,947 B1 | 3/2003 | Weaver et al. .............. 337/139 |
| 6,535,311 B1 | 3/2003 | Lindquist .................... 359/128 |
| 6,567,295 B2 | 5/2003 | Taussig et al. .............. 365/105 |
| 6,587,612 B1 | 7/2003 | Mitchell et al. .............. 385/18 |
| 6,672,724 B1 * | 1/2004 | Peterson et al. .............. 353/81 |
| 6,708,492 B2 | 3/2004 | Sinclair ......................... 60/527 |
| 6,780,491 B1 | 8/2004 | Cathey et al. ............... 428/143 |
| 6,785,039 B2 * | 8/2004 | Wendland, Jr. ............. 359/290 |
| 6,804,959 B2 | 10/2004 | Sinclair ......................... 60/527 |
| 2001/0003798 A1 | 6/2001 | McGovern et al. ........... 606/41 |
| 2002/0165521 A1 | 11/2002 | Cioanta et al. ............. 604/509 |
| 2003/0164814 A1 * | 9/2003 | Starkweather et al. ...... 345/102 |
| 2004/0218292 A1 * | 11/2004 | Huibers ....................... 359/850 |

FOREIGN PATENT DOCUMENTS

| | | |
|---|---|---|
| EP | 1 289 273 A1 | 3/2003 |
| EP | 0 692 729 B1 | 4/2003 |
| EP | 1 341 025 A1 | 9/2003 |
| EP | 1 143 467 B1 | 9/2004 |
| FR | 2 703 475 | 10/1994 |
| FR | 2 749 693 | 12/1997 |
| JP | 10-39239 | 2/1998 |
| WO | WO 98/35258 | 8/1998 |
| WO | WO 99/36825 | 7/1999 |
| WO | WO 00/627268 | 11/2000 |
| WO | WO 00/73839 A1 | 12/2000 |
| WO | WO 01/42844 A2 | 6/2001 |
| WO | WO 01/45120 A2 | 6/2001 |
| WO | WO 01/84531 A1 | 11/2001 |
| WO | 1 201 602 A2 | 5/2002 |

OTHER PUBLICATIONS

Lee, J. Y. et al., "A Characterization of the Thermal parameters of Thermally Driven Polysilicon Microbridge Actuators Using Electrical Impedance Analysis", *Sensors and Actuators*, May 1999, 75(1)(4), 86–98, XP004147068.

Miller, D.C. et al., "Micromachined, Flip–Clip Assembled, Actuatable Contacts for Use in High density Interconnection in Electronics Packaging", *Sensors and Actuators*, 2001, 89, 76–87.

Noworolski, J. Mark. et al., "Process for In–Plane and Out–Plane Single–Crystal–Silicon thermal Microactuators", *Sensors and Actuators*, 1996, 55, 65–69.

Seki, T. et al., "Thermal Buckling Actuator for Micro Relays", *Transducers*, 1997, 1153–1156.

Sinclair, M.J., "1D and 2D Scanning Mirrors Using Thermal Buckle–Beam Actuation", *Proceedings of the SPIE*, Dec. 2001, 4592(17), 307–314, XP009019263.

Sinclair, M.J., "A High Force Low Area MEMS Thermal Actuators", *The 7$^{th}$ Intersociety Conference on Thermal and Thermomechanical Phenomena in Electronic Systems*, May 2000, 127–132, XP010510393.

Sinclair, M. "A High Frequency Resonant Scanner Using Thermal Actuation", *Technical Digest, 15$^{th}$ International Conference on Micro Electro Mechanical Systems*, Jan. 2002, 698–701.

* cited by examiner

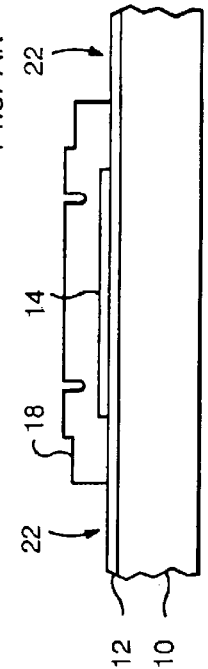
FIG. 1 Prior Art
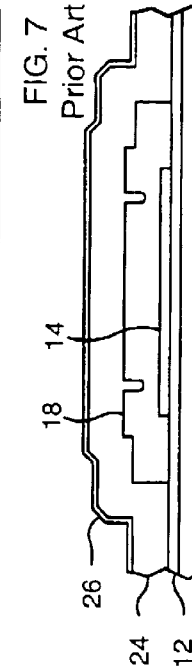
FIG. 2 Prior Art
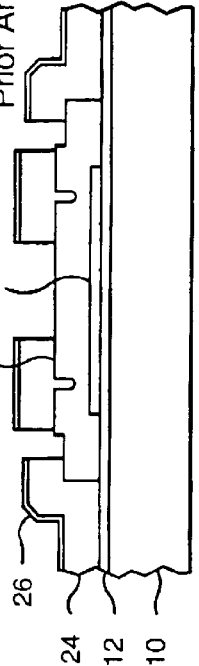
FIG. 3 Prior Art
FIG. 4 Prior Art
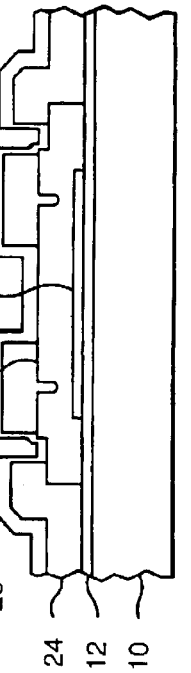
FIG. 5 Prior Art
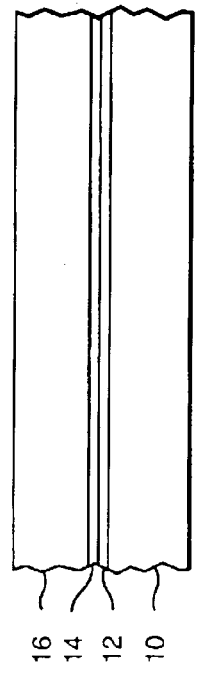
FIG. 6 Prior Art
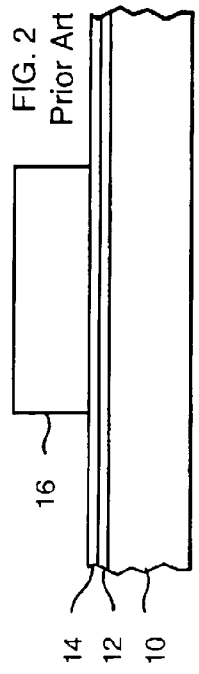
FIG. 7 Prior Art
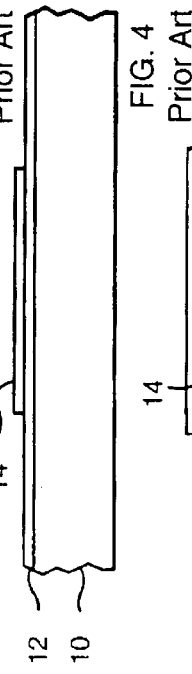
FIG. 8 Prior Art
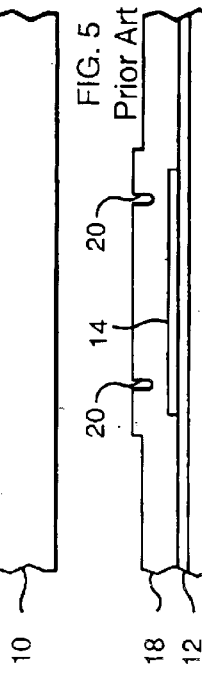
FIG. 9 Prior Art

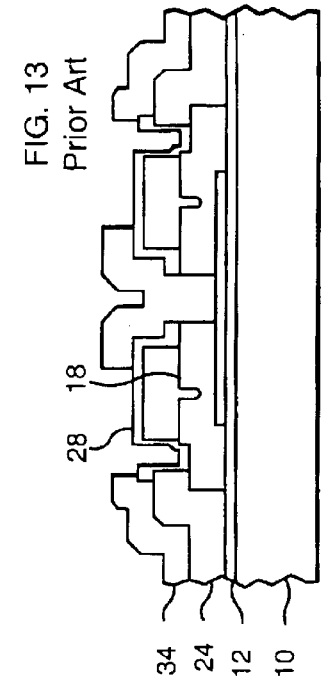
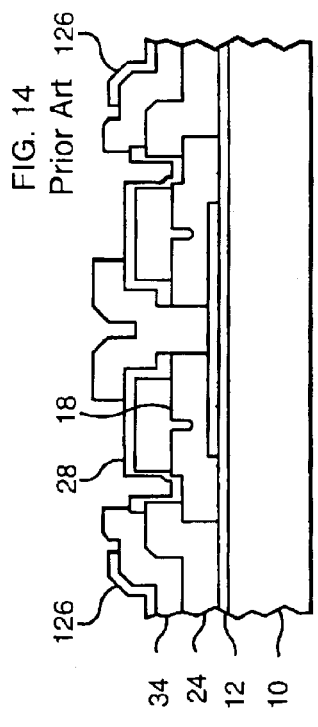
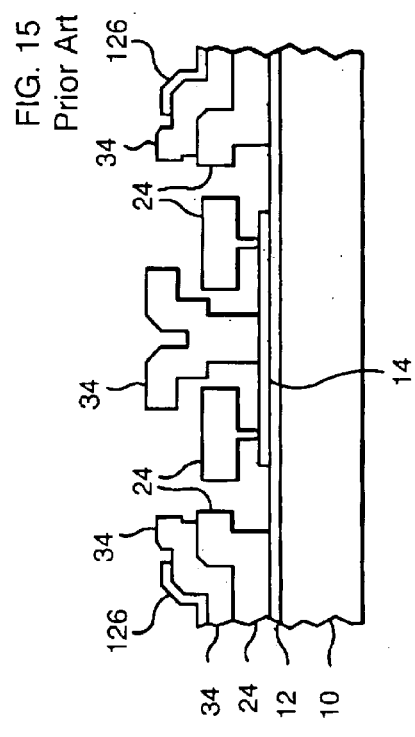
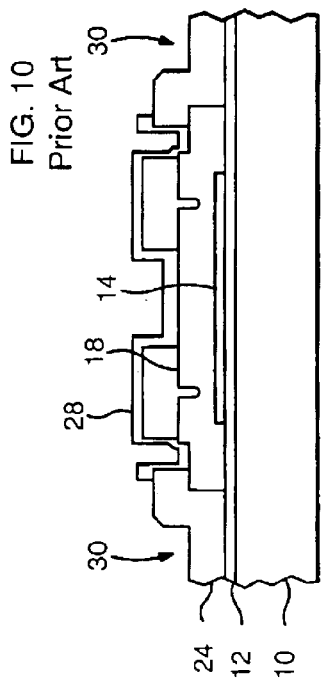
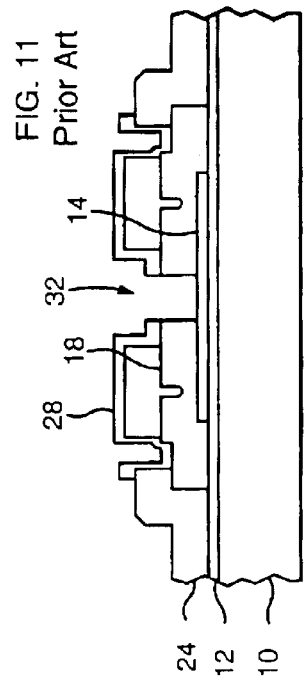
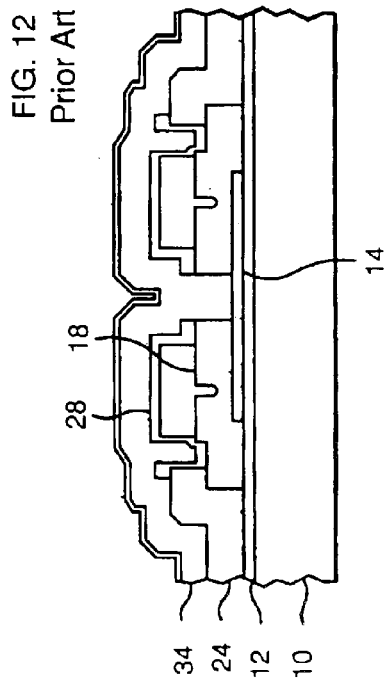

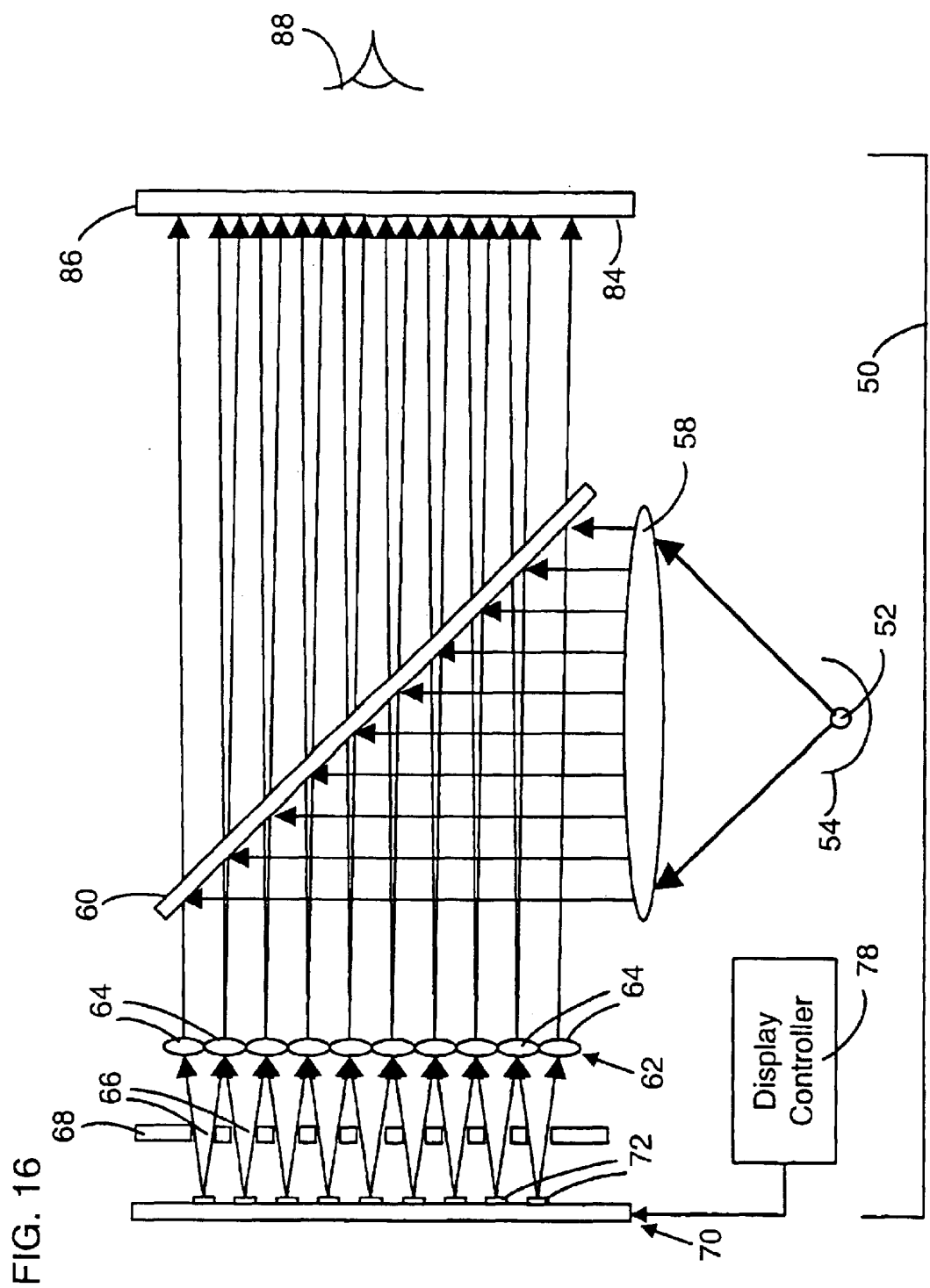

ELECTROSTATIC BIMORPH ACTUATOR

REFERENCE TO RELATED APPLICATIONS

This application is a continuation application and claims priority to U.S. patent application Ser. No. 10/112,369, filed Mar. 29, 2002, entitled "Electrostatic Bimorph Actuator", which is incorporated herein by reference in its entirety.

FIELD OF THE INVENTION

The present invention relates to microelectromechanical system (MEMS) actuators and, in particular, to electrostatic microelectricalmechanical system (MEMS) actuators that employ a bimorph construction.

BACKGROUND AND SUMMARY OF THE INVENTION

Microelectromechanical system (MEMS) actuators provide control of very small components that are formed on semiconductor substrates by conventional semiconductor (e.g., CMOS) fabrication processes. MEMS systems and actuators are sometimes referred to as micromachined systems-on-a-chip. MEMS systems can be used in a wide range of applications.

One of the conventional MEMS actuators is the electrostatic actuator or comb drive. Commonly, such actuators include two comb structures that each have multiple comb fingers aligned in a plane parallel to a substrate. The fingers of the two comb structures are interdigitated with each other. Potential differences applied to the comb structures establish electrostatic interaction between them, thereby moving the comb structures toward and away from each other. The conventional electrostatic actuator or comb drive is limited to motion generally within or parallel to the plane of the underlying substrate.

The present invention includes an electrostatic bimorph actuator that includes a cantilevered flexible bimorph arm that is secured at one end to a planar substrate. In an electrostatically activated state the bimorph arm is generally parallel to the planar-substrate. In a relaxed state, residual stress in the bimorph arm causes its free end to extend out-of-plane from the planar substrate.

In one implementation the actuator includes a substrate electrode that is secured to, but electrically isolated from the substrate and positioned under and in alignment with the bimorph arm. An electrical potential difference applied between the bimorph arm and the substrate electrode imparts electrostatic attraction between the bimorph arm and the substrate electrode to activate the actuator. As an exemplary application in which such actuators could be used, a microelectrical mechanical optical display system is described.

Additional objects and advantages of the present invention will be apparent from the detailed description of the preferred embodiment thereof, which proceeds with reference to the accompanying drawings.

BRIEF DESCRIPTION OF THE DRAWINGS

FIGS. 1–15 are cross-section views of a general multi-user MEMS process known in the prior art for fabricating microelectrical mechanical devices. Cross-hatching is omitted to improve clarity of the prior art structure and process depicted.

FIG. 16 is a schematic side view of a microelectrical mechanical (MEMS) optical display system illustrating an exemplary operating environment for an electrostatic actuator of the present invention.

DETAILED DESCRIPTION OF PREFERRED EMBODIMENTS

Figure 17:
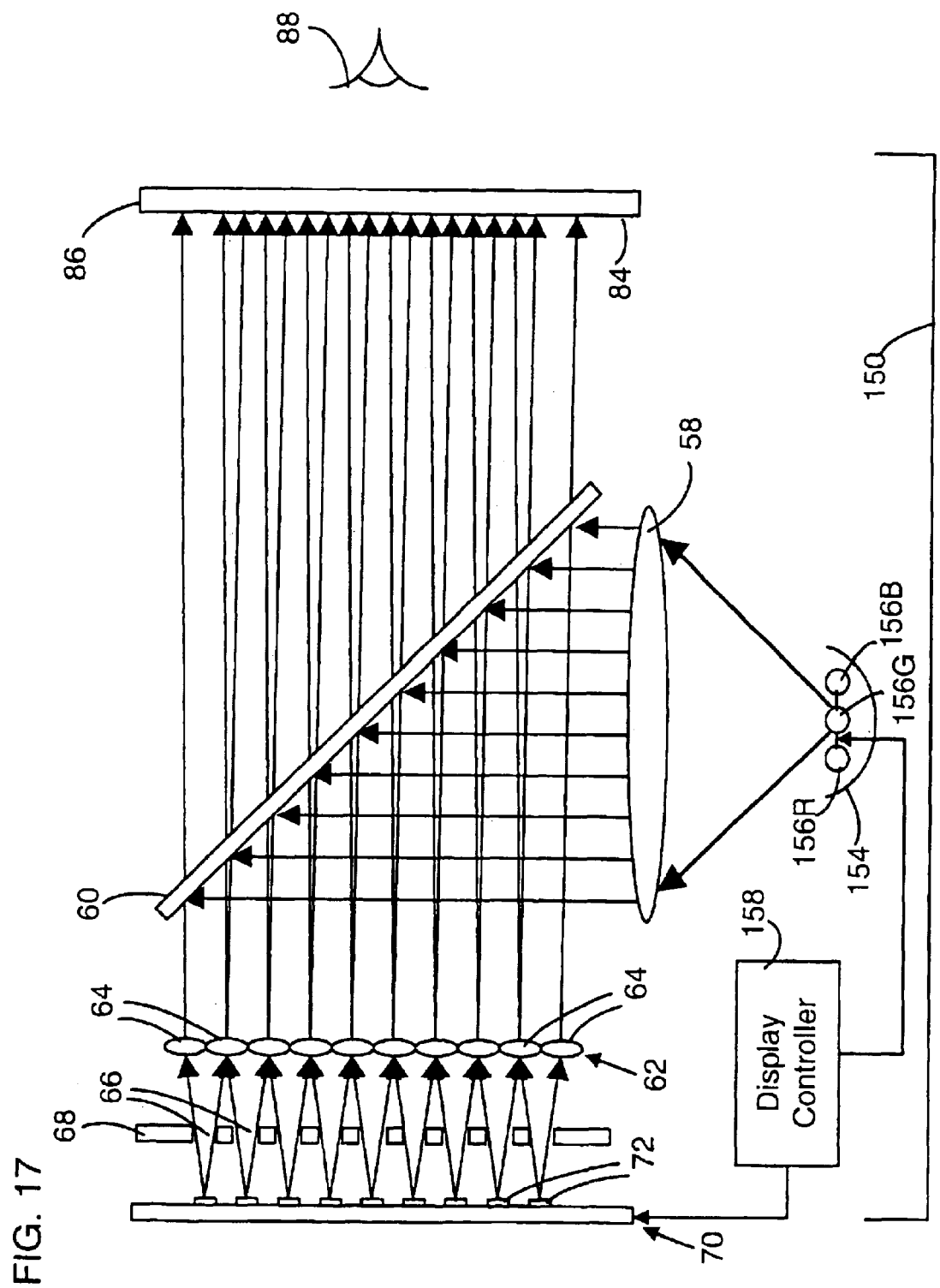
FIG. 17 is a schematic side view of another implementation of a microelectrical mechanical (MEMS) optical display system illustrating an exemplary operating environment for an electrostatic actuator of the present invention.

To assist with understanding the present invention, the general procedure for fabricating micromechanical devices using the MUMPs process is explained with reference to FIGS. 1–15.

The MUMPs process provides three-layers of conformal polysilicon that are etched to create a desired physical structure. The first layer, designated POLY 0, is coupled to a supporting wafer, and the second and third layers, POLY 1 and POLY 2, respectively, are mechanical layers that can be separated from underlying structure by the use of sacrificial layers that separate layers and are removed during the process.

The accompanying figures show a general process for building a micro-motor as provided by the MEMS Technology Applications Center, 3021 Cornwallis Road, Research Triangle Park, N.C.

The MUMPs process begins with a 100 mm n-type silicon wafer 10. The wafer surface is heavily doped with phosphorus in a standard diffusion furnace using POCI 3 as the dopant source. This reduces charge feed-through to the silicon from electrostatic devices subsequently mounted on the wafer. Next, a 600 nm low-stress Low Pressure Chemical Vapor Deposition (LPCVD) silicon nitride layer 12 is deposited on the silicon as an electrical isolation layer. The silicon wafer and silicon nitride layer form a substrate.

Next, a 500 nm LPCVD polysilicon film—POLY 0 14—is deposited onto the substrate. The POLY 0 layer 14 is then patterned by photolithography; a process that includes coating the POLY 0 layer with a photoresist 16, exposing the photoresist with a mask (not shown) and developing the exposed photoresist to create the desired etch mask for subsequent pattern transfer into the POLY 0 layer (FIG. 2). After patterning the photoresist, the POLY 0 layer 14 is etched in a Reactive Ion Etch (RIE) system (FIG. 3).

With reference to FIG. 4, a 2.0 µm phosphosilicate glass (PSG) sacrificial layer 18 is deposited by LPCVD onto the POLY 0 layer 14 and exposed portions of the nitride layer 102. This PSG layer, referred to herein as a First Oxide, is removed at the end of the process to free the first mechanical layer of polysilicon, POLY 1 (described below) from its underlying structure; namely, POLY 0 and the silicon nitride layers. This sacrificial layer is lithographically patterned with a DIMPLES mask to form dimples 20 in the First Oxide layer by RIE (FIG. 5) at a depth of 750 nm. The wafer is then patterned with a third mask layer, ANCHOR1, and etched (FIG. 6) to provide anchor holes 22 that extend through the First Oxide layer to the POLY 0 layer. The ANCHOR 1 holes will be filled in the next step by the POLY 1 layer 24.

After the ANCHOR1 etch, the first structural layer of polysilicon (POLY 1) 24 is deposited at a thickness of 2.0 µm. A thin 200 nm PSG layer 26 is then deposited over the POLY 1 layer 24 and the wafer is annealed (FIG. 7) to dope the POLY 1 layer with phosphorus from the PSG layers. The anneal also reduces stresses in the POLY 1 layer. The POLY 1 and PSG masking layers 24, 26 are lithographically patterned to form the structure of the POLY1 layer. After etching the POLY 1 layer (FIG. 8), the photoresist is stripped and the remaining oxide mask is removed by RIE.

After the POLY 1 layer 24 is etched, a second PSG layer (hereinafter "Second Oxide") 28 is deposited (FIG. 9). The Second Oxide is patterned using two different etch masks with different objectives.

First, a POLY1_POLY2_VIA etch (depicted at 30) provides for etch holes in the Second Oxide down to the POLY 1 layer 24. This etch provide a mechanical and electrical connection between the POLY 1 layer and a subsequent POLY 2 layer. The POLY1_POLY2_VIA layer is lithographically patterned and etched by RIE (FIG. 10).

Second, an ANCHOR2 etch (depicted at 32) is provided to etch both the First and Second Oxide layers 18, 28 and POLY 1 layer 24 in one step (FIG. 11). For the ANCHOR2 etch, the Second Oxide is lithographically patterned and etched by RIE in the same way as the POLY1_POLY2_VIA etch. FIG. 11 shows the wafer cross section after both POLY1_POLY2_VIA and ANCHOR2 etches have been completed.

A second structural layer, POLY 2, 34 is then deposited at a thickness of 1.5 µm, followed by a deposition of 200 nm of PSG. The after is then annealed to dope the POLY 2 layer and reduce its residual film stresses. Next, the POLY 2 layer is lithographically patterned with a seventh mask and the PSG and POLY 2 layers are etched by RIE. The photoresist can then be stripped and the masking oxide is removed (FIG. 13).

The final deposited layer in the MUMPs process is a 0.5 µm metal layer 36 that provides for probing, bonding, electrical routing and highly reflective mirror surfaces. The wafer is patterned lithographically with the eighth mask and the metal is deposited and patterned using a lift-off technique. The final, unreleased exemplary structure is shown in FIG. 14.

Lastly, the wafers undergo sacrificial release and test using known methods. FIG. 15 shows the device after the sacrificial oxides have been released.

In preferred embodiments, the device of the present invention is fabricated by the MUMPs process in accordance with the steps described above. However, the device of the present invention does not employ the specific masks shown in the general process of FIGS. 1–15, but rather employs masks specific to the structure of the present invention. Also, the steps described above for the MUMPs process may change as dictated by the MEMS Technology Applications Center. The fabrication process is not a part of the present invention and is only one of several processes that can be used to make the present invention.

FIG. 16 is a diagrammatic side view of a microelectrical mechanical structure (MEMS) optical display system 50 illustrating an exemplary operating environment for an electrostatic actuator of the present invention. Display system 50 includes a light source 52 and reflector 54 that direct illumination light to a condenser lens 58. A beam splitter 60 receives the illumination light from condenser lens 58 and reflects the light toward a microlens array. 62 having a two-dimensional array of lenslets 64 (only one dimension shown). Lenslets 64 of microlens array 62 receive the illumination light and focus it through apertures 66 in an aperture plate 68 toward a microelectrical mechanical structure (MEMS) reflective modulator 70. Microlens array 62 could be formed as a molded array of plastic lenses or an array of holographic lenses, also referred to as hololenses, or may be an assembled array of conventional glass lenses.

MEMS reflective modulator 70 has a two-dimensional array of microelectrical mechanical structure (MEMS) reflectors 72 that are positioned opposite corresponding apertures 66 in aperture plate 68. Each MEMS reflector 72 corresponds to a picture element or pixel and is separately controllable by a display controller 78 to selectively reflect illumination light back through an aperture 66 according to an image control signal, thereby to form a display image. For example, each MEMS reflector 72 would direct light back through its aperture 66 for an amount of time in proportion to the brightness of the corresponding pixel for a given pixel period.

Light reflected by MEMS reflectors 72 through apertures 66 passes through lenslets 64 and beam splitter 60 to a rear surface 84 of a transmissive display screen 86 for viewing by an observer 88. In an alternative implementation, a projecting lens array may be positioned between beam splitter 60 and transmissive display screen 86 to enlarge or reduce the optical field so that it provides a desired image size on transmissive display screen 86. MEMS reflective modulator 70, aperture plate 68, and microlens array 62 may be considered a display engine 90 that may be compactly and efficiently manufactured for a wide range of applications.

MEMS optical display system 50 has a number of advantages over commonly available liquid crystal displays. For example, MEMS reflective modulator 70 does not require that the illumination light be polarized, in contrast to the typical operation of liquid crystal cells. This eliminates the expense and light attenuation that typically accompanies polarization. Moreover, MEMS reflective modulator 70 can pass unmodulated light with virtually no attenuation, whereas typical liquid crystal cells significantly attenuate light. Similarly, MEMS reflective modulator 70 can provide much higher contrast ratios than liquid crystal cells because light is either losslessly reflected through apertures 66 or completely blocked by aperture plate 68 to provide complete modulation of the light. Finally, MEMS reflective modulator 70 can be manufactured by conventional CMOS circuit techniques without requiring the complex processes typically required for liquid crystal displays.

In one implementation, for example, MEMS reflective modulator 70 could include a 200×200 array of MEMS reflectors 72 for controlling light passing through a corresponding 200×200 array of apertures 66. In this implementation, for example, microlens array 62 could include 200×200 lenslets 64 that each have a focal length of about 1 mm, and apertures 66 may be positioned in a right, regular array with separations of about 50 μm between them. MEMS reflective modulator 70 in such an implementation could have dimensions of 1 cm×1 cm. With lenslets 64 of projection microlens array 80 providing magnification of about 2.5, display screen 86 could have dimensions of about 2.5 cm×2.5 cm, or about 1 inch×1 inch.

FIG. 17 is a diagrammatic side view of a microelectrical mechanical structure (MEMS) optical display system 150 showing one implementation of a polychromatic illumination source 152 and an associated reflector 154. Components of MEMS optical display system 150 that are generally the same as those of display system 50 are indicated by the same reference numerals.

Illumination source 152 includes multiple (e.g., three) color component light sources (e.g., lamps) 156R, 156G, and 156B that are positioned generally in a line and generate red, green, and blue light, respectively. A display controller 158 that separately controls MEMS reflectors 72 also activates color component light sources 156R, 156G, and 156B separately, generally known as field-sequential color. During times that it successively activates color component light sources 156R, 156G, and 156B, display controller 158 applies control signals to MEMS reflectors 72 corresponding to red, green, and blue image components, thereby to form color component images in a field-sequential manner.

For example, color component images that are generated at a rate of 180 Hz can provide an image frame rate of 60 Hz. In one exemplary implementation, a display of 200×200 multi-color pixels could employ microlens arrays 62 with a 204×204 array of lenslets 64 to compensate for different optical paths taken by different color components of light forming the display gamut. Aperture plate 68 and MEMS reflective modulator 70 would include corresponding arrays of apertures 66 and reflectors 72, respectively. As an alternative implementation, it will be appreciated that multiple successive colors of illumination could be obtained by a spinning color filter wheel and a white light source, as is known in the art.

Figure 18:
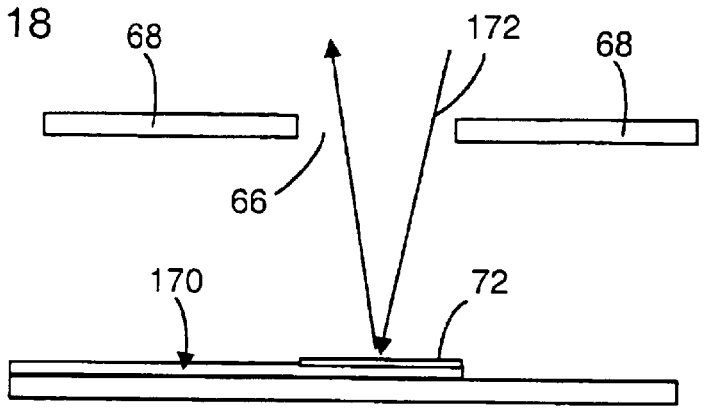
FIGS. 18 and 19 are schematic side views of an electrostatic bimorph MEMS actuator of the present invention in respective activated and relaxed states.
Figure 19:
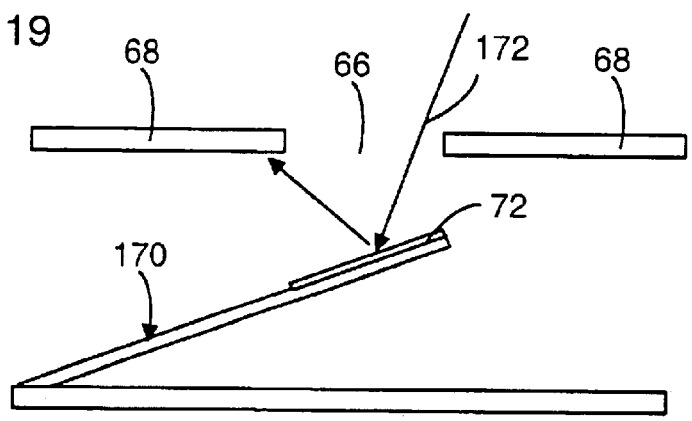

FIGS. 18 and 19 are schematic side views of an electrostatic bimorph MEMS actuator 170 according to the present invention in respective activated and relaxed states that can be used, for example, to control MEMS reflector 72. FIG. 18 shows MEMS reflector 72 with an orientation behind an associated aperture 66 generally perpendicular to a light propagation direction 172. In this activated, pixel ON state, illumination light directed through aperture 66 is reflected by MEMS reflector 72 back through aperture 66 to be included in a display image. FIG. 19 shows MEMS reflector 72 with an inclined or a tilted orientation relative to light propagation direction 172. In this relaxed, pixel OFF state, illumination light directed through aperture 66 is reflected by MEMS reflector 72 toward a solid region of aperture plate 68 to be blocked and excluded from a display image.

Figure 20:
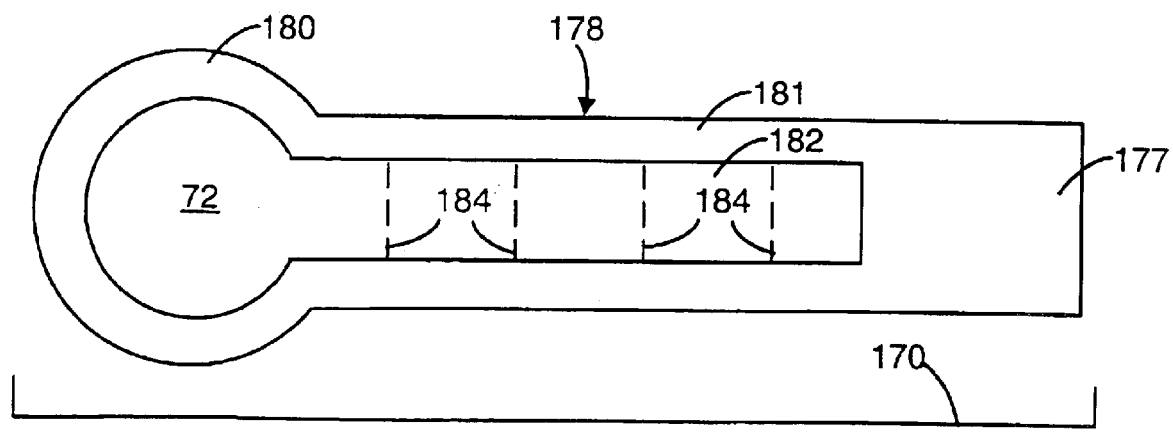
FIG. 20 is a plan view of an electrostatic bimorph MEMS actuator.
Figure 21:
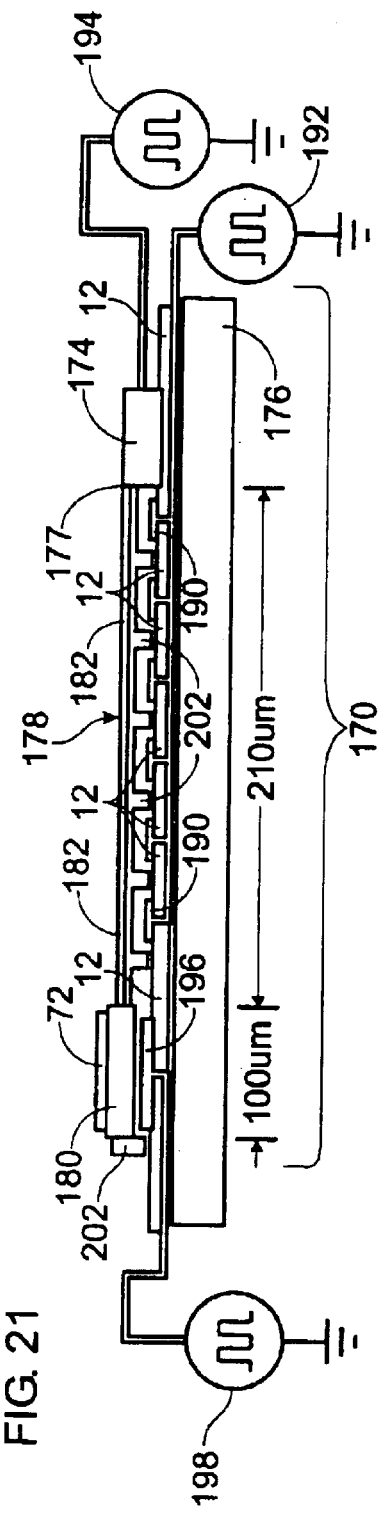
FIGS. 21 and 22 are side views of the electrostatic bimorph MEMS actuator of FIG. 20 in respective activated and relaxed states.
Figure 22:
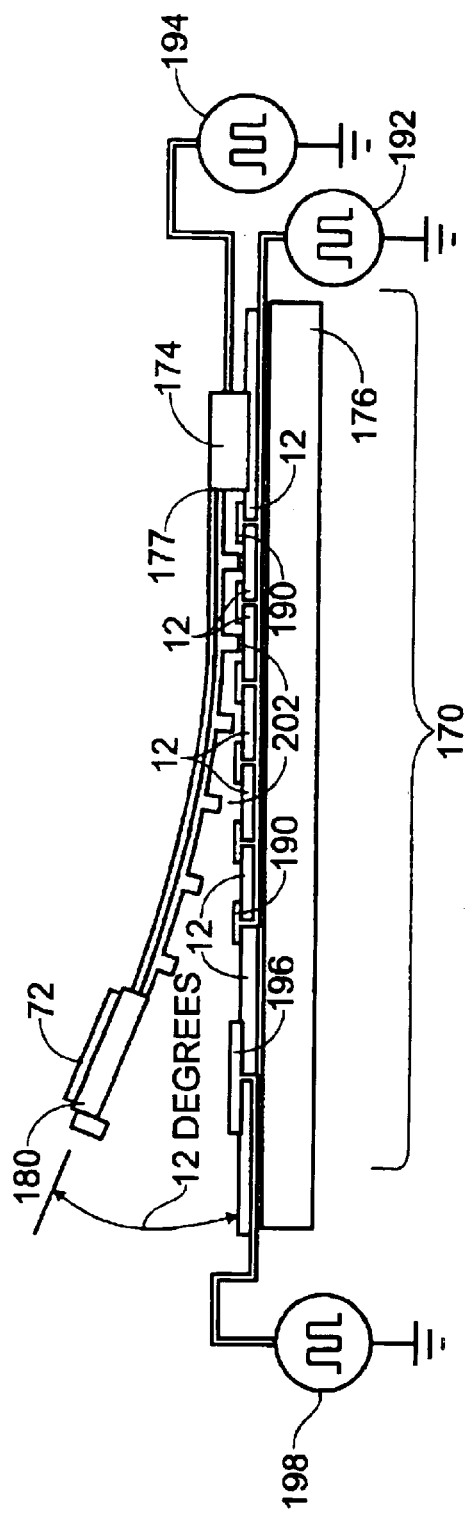

FIG. 20 is a plan view of MEMS actuator 170, and FIGS. 21 and 22 are side views of MEMS actuator 170 in its respective activated and relaxed states.

Figure 23:
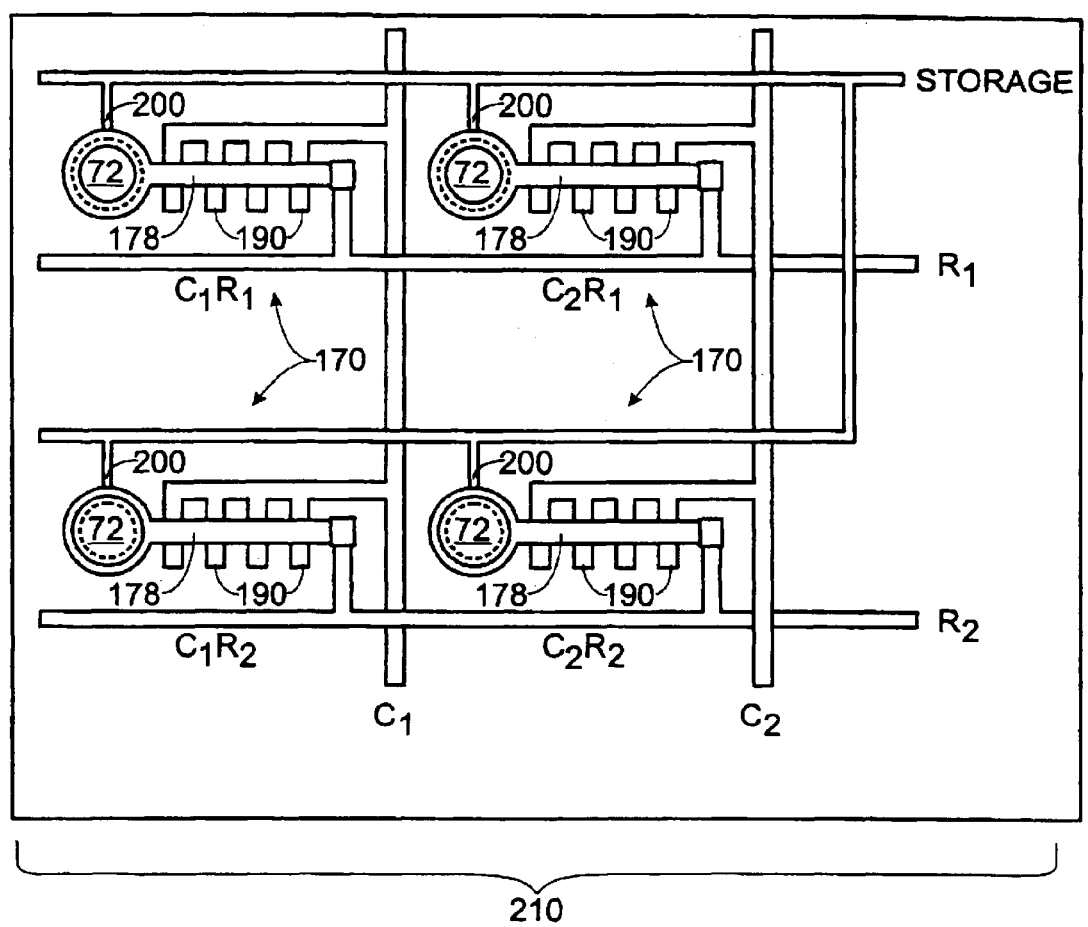
FIG. 23 is a schematic diagram of a 2×2 array of electrostatic bimorph MEMS actuators having a storage or memory capability.

MEMS actuator 170 includes a structural anchor 174 (FIGS. 21 and 22) that is secured to a substrate 176, which includes nitride layer 12. In the view of FIGS. 21 and 22, nitride layer 12 appears to be in segments due to the schematic representation of electrical connections to electrodes 190. FIG. 23 correctly illustrates electrical connections 191 between electrodes 190 as being positioned on the nitride layer 12 and laterally offset from flexible arm 178. Note that the nitride layer 12 is formed continuously over substrate 176 and not as the segments suggested by FIGS. 21 and 22. One end 177 of a cantilevered flexible arm 178 is secured to or formed integrally from anchor 174 and extends to a free or floating paddle end 180 that supports MEMS reflector 72 (e.g. formed of gold). Flexible arm 178 includes a semiconductor (e.g., polysilicon) arm base 181 and a residual stress layer 182 of a material other than the semiconductor (e.g., polysilicon) of arm base 181.

Residual stress layer 182 is formed of a material (e.g., gold) that is selected to have a coefficient of expansion different from that of the semiconductor (e.g., polysilicon) material of arm base 181. In the illustrated implementation, residual stress layer 182 is formed on top surface of arm base 181. The differing thermal coefficients of expansion of arm base 181 and gold and residual stress layer 182 characterize flexible arm 178 as a bimorph.

Optional flex scores 184 may extend into a top surface of arm base 181 and extend across its length, either part way or completely (the former shown). Flex scores 184 are spaced apart from each other and are generally perpendicular to the length of flexible arm 178. In one implementation, residual stress layer 182 is formed between optional flex scores 184 when they are present. Flex scores 184 may simply be formed as a product or consequence of the conformality of MEMS processing as depressions in the Poly2 layer made from producing stand-off dimples 202, which are described below.

MEMS actuator 170 includes one or more electrostatic activation electrodes 190 that are formed in or on, but insulated from substrate 176 at spaced-apart intervals along and underneath flexible arm 178. Activation electrodes 190 and flexible arm 178 are electrically connected to respective actuator controllers 192 and 194. An optional memory or lock electrode 196 is formed under floating paddle end 180 and electrically connected to an optional memory controller 198.

In the activated, display pixel ON state illustrated in FIG. 21, complementary signals or electrical states are applied by actuator controllers 192 and 194 to respective activation electrodes 190 and flexible arm 178 to impart electrostatic attraction between them. The electrostatic attraction between activation electrodes 190 and flexible arm 178 functions to hold flexible arm 178 generally flat against substrate 176. Separate activation of optional memory controller 198, connected to a memory electrodes 196 and 200, can then serve to hold flexible arm 178 generally flat against substrate 176 even after the complementary signals provided to activation electrodes 190 and flexible arm 178 are relaxed.

Stand-off dimples 202 extending from flexible arm 178 toward substrate 176 hold flexible arm 178 in spaced-apart relation to substrate 176 in the activated, pixel ON state. Dimples 202 contact the electrically insulating (e.g., nitride layer) of substrate 176. A dimple 202 at the end of paddle end 180 also keeps reflector 72 flat (i.e., parallel to substrate 176) in the activated, pixel ON state, as well as keeping flexible arm 178 spaced apart from memory electrode 200. Stand-off dimples 202 may extend part way or completely across flexible arm 178.

In the relaxed, pixel OFF state illustrated in FIG. 22, complementary signals or electrical states are not applied by actuator controllers 192 and 194 to respective activation electrodes 190 and flexible arm 178, or the complementary signals are insufficient to activate actuator 170. Likewise, optional memory controller 198 is not activated. Accordingly, residual stress between arm base 181 and residual stress layer 182 serves to bend, tilt, or "curl" flexible arm 178 out of the plane of the underlying substrate 176, as illustrated in FIG. 21.

In one implementation, reflector 72 in the relaxed, pixel OFF state rests at an orientation of about 12 degrees with respect to substrate 176. In one implementation, a transition time of about 1 ms is needed to activate or release actuator 170 (i.e., change between the relaxed, pixel OFF state and the activated, pixel ON state). It will be appreciated that this transition time can be changed, and substantially reduced.

FIG. 23 shows a schematic diagram of a 2×2 array 210 of actuators 170 having a storage or memory capability to illustrate the operation of actuators 170. The operation of array 210 is described with reference to the following activation or control signals:

Vse=storage electrode voltage
Ry=mirror arm voltage for Row-y
Cx=actuation electrode voltage for Column-x As one exemplary implementation, actuation of a single actuator 170 at a location CxRy in array 210 (e.g., location C1R2) to activated, pixel ON state is accomplished by applying a row activation voltage (e.g., +60 volts) to a row electrode Ry (e.g., R2), which delivers the row activation voltage to the flexible arm 178 of each actuator in the row. A column activation voltage (e.g., −60 volts) is applied to a column electrode Cx (e.g., C1), which delivers the column activation voltage to the activation electrodes 190 of each actuator 170 in the column. These exemplary row and column activation voltages establish at actuator 170 at a location CxRy in array 210 (e.g., location C1R2) a voltage differential of 120 volts between flexible arm 178 and activation electrodes 190. With a voltage differential of at least 114 volts needed for actuation, the 120 volt differential is sufficient to activate the actuator 170.

The activation voltages need be applied only temporarily if a memory or storage voltage is applied to memory electrode 200 to establish a differential relative to the row activation voltage delivered to flexible arm 178. In particular, the activation voltages need be applied only long enough (e.g., 1 ms in one implementation) for flexible arm 178 to be deflected to and held by memory electrode 200.

With row and column electrodes other than row electrode Ry and column electrode Cx held at a median potential (e.g., 0 volts in one implementation), application of the row activation voltage to activation row electrode Ry and column activation voltage to column electrode Cx will function to activate only actuator 170 at location CxRy. With Ry=+60 volts and Cx=−60 volts, for example, other actuators 170 in row Ry and column Cx will each receive a voltage differential of only 60 volts, which is insufficient for actuation. Moreover, with storage or memory electrode 200 energized, all actuators 170 not specifically being activated will retain their previous states. For example, storage or memory electrode 200 may be energized with a voltage of +60 volts, for example. Such a memory or storage potential establishes between all storage electrodes 200 and actuators 170 that are not specifically being activated or addressed a differential of at least 25 volts that is sufficient to hold them in the pixel ON state.

Figure 24:
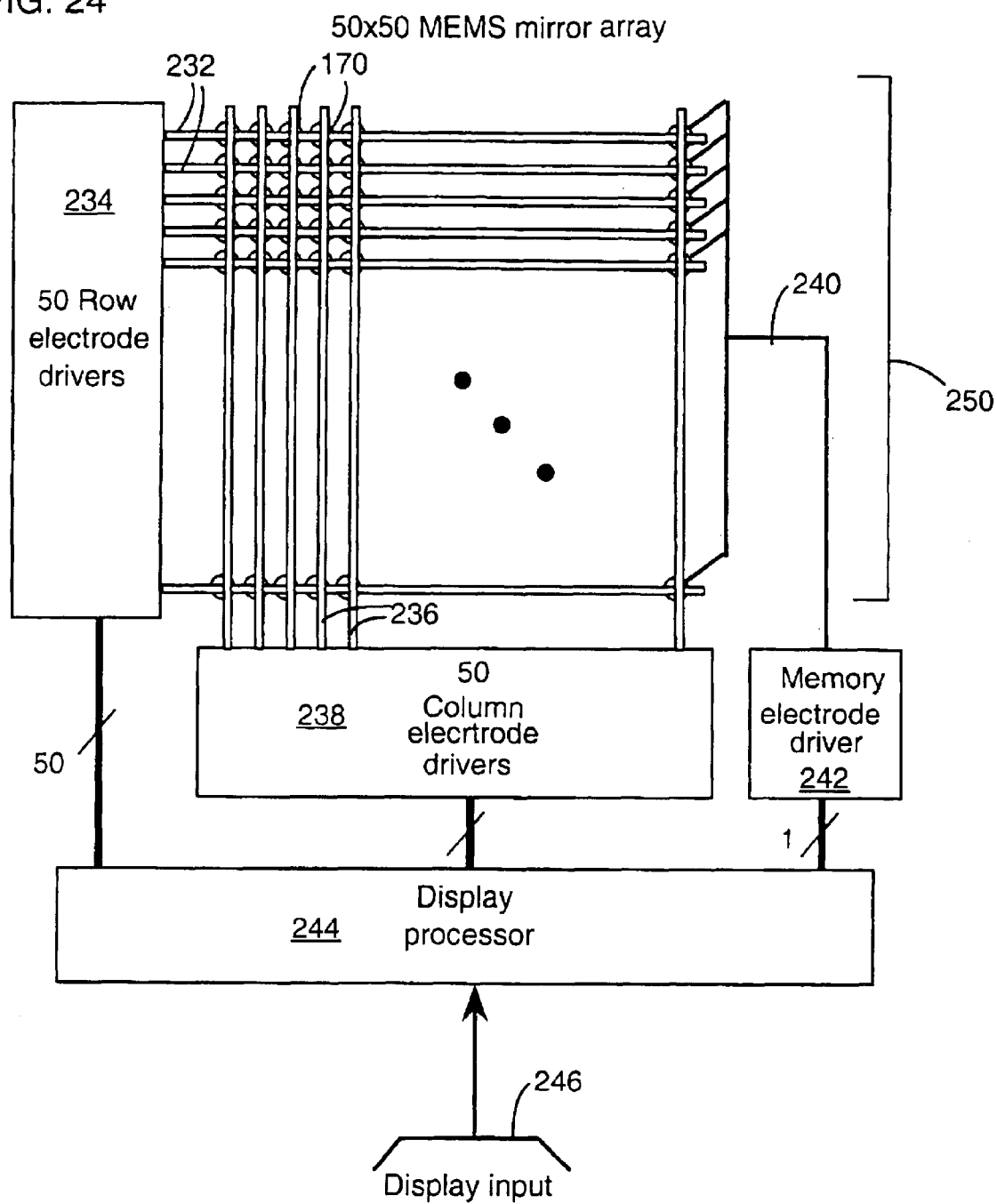
FIG. 24 is a schematic diagram of a 50×50 array of electrostatic bimorph MEMS actuators having a storage or memory capability.

Actuators 170 may be considered to have an actuation (or activation) state in which reflector 72 is moved into a flat (i.e., parallel to substrate 176) position for the activated, pixel ON state, a release state in which reflector 72 is released from the flat (i.e., parallel to substrate 176) position and curls out-of-plane for the relaxed, pixel OFF state, and a storage state in which in which reflector 72 is held in the flat (i.e., parallel to substrate 176) position after actuation. The actuation state and the storage state may be represented by the following equations:

$A_{xy}=|R_y-C_x|$=actuation potential difference for mirror RxCy $H_{xy}=|R_y-V_{se}|$=hold potential difference via storage electrode for mirrors on $R_y$ Actuation (from the released state)
The mirror will transition to the actuated (down, parallel to the substrate) state only if
$A_{xy}$>114 volts.
Release (from the actuated state)
The mirror will transition to the released (up) state only if
$A_{xy}$<53 volts and $H_{xy}$<25 volts
Storage
The mirror will retain its current state only if
$A_{xy}$>53 volts or $H_{xy}$>25 volts if state=actuated
$A_{xy}$<114 volts if state=released FIG. 24 is a fragmentary schematic diagram of a 50×50 array 230 of actuators 170 having a storage or memory capability. Array 230 employs 50 row electrodes 232 that are coupled to corresponding row drivers 234, 50 column electrodes 236 that are coupled to corresponding column drivers 238, and a common storage electrode 240 for all actuators 170 connected to a storage driver 242. It will be appreciated that row drivers 234 and column drivers 238 may include an individual driver for each of respective electrodes 232 and 236, or may include a lesser number of drivers that are multiplexed among the electrodes. Drivers 234, 238, and 242 and other electronics can be formed on substrate 176 or as separate devices, depending complexity, packaging and economics. A display processor 244 receives display signals from a display input 246 and provides corresponding control signals to drivers 234, 238, and 242.

In this implementation, row drivers 234 switch between 0 and +60 volts, and column drivers 238 switch between 0, +60 and −60 volts. Storage electrode driver 242 switches between 0 and +60 volts. If the actuators 170 are sequentially addressed, a period of about 50×50×1 ms, or 2.5 seconds, will be needed to address all actuators 170 in array 230. It will be appreciated that only those actuators 170 with a reflector 72 requiring a state change need be addressed. Accordingly, less time would be required if fewer than all actuators 170 were to be addressed. If 50 row drivers 234 and 50 column drivers 238 are employed, whole rows or columns can be addressed simultaneously, and the actuators 170 in the rows or columns activated in parallel, thereby decreasing the array addressing period to about 50 ms.

Figure 25:
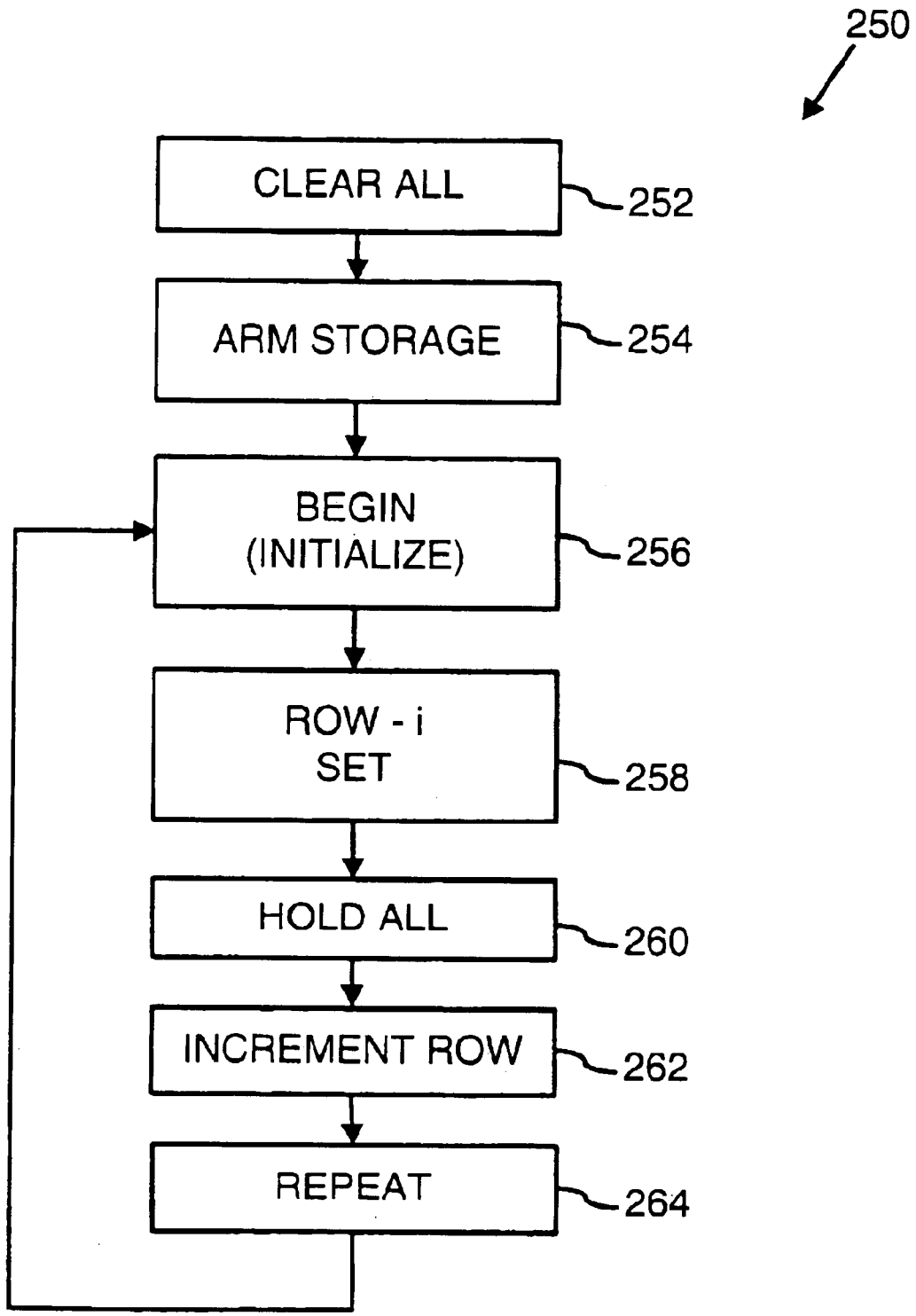
FIG. 25 is a flow diagram of a row-sequential addressing method.

FIG. 25 is a flow diagram of a row-sequential addressing method 250 described with reference to the exemplary implementation of actuator 170 and array 230 described above. It will be appreciated that row-sequential addressing method 250 could be readily adapted to other implementations of actuators 170 and arrays 230.

Step 252 indicates a "Clear All" step in which the reflectors 72 of all actuators 170 in array 250, for example, are returned to a relaxed, no pixel off state. The Clear All of step 252 is optional and may be represented by the following drive voltages:

Vse=Ry=Cx=0 volts (for all x and y).

Step 254 indicates an "Arm Storage" step in which the storage electrodes 240 for all actuators 170 are activated or energized by storage driver 242. The Arm Storage of step 254 may be represented by the following drive voltage:

Vse=+60 volts.

Step 254 applies +60 volts to storage electrodes 240 so any activated actuator 170 is held in its activated, pixel ON state until released. This step does not affect actuators in the relaxed, pixel OFF because the activation of storage electrodes 240 is insufficient to activate an actuator 170 in the relaxed state.

Step 256 indicates a "Begin" step in which a counter of rows or columns (e.g., rows) is initialized at a value "1."

Step 258 sets the row counter "i" to a first row of actuators 170 in array 230. The Begin of step 256 may be represented as:

Set "i"=1.

Step 258 indicates a "Row-i Set" step in which the storage electrodes 240 for all actuators 170 are activated or energized by storage driver 242. The Row-i Set of step 258 may be represented by the following drive voltages:

Set $Ry=i=+60$ volts, $Cx=$data states for $Ry=iC1, Ry=iC2, \ldots, Ry=iC50$.

To activate actuators 170 within Row-i ($Ry=i=+60$ volts), set $Cx=-60$ volts, giving an activation differential:

$(Ax,y=i=|60-(-60)|=120$ volts=>mirror $RxCy$ is actuated).

To release actuators 170 within Row-I, ($Ry=i=+60$ volts), set $Cx=+60$ volts, giving a release differential:

$(Ax,y=j=|60-60|=0$ volts, $Hx,y=j=|60-60|=0$ volts (no hold)

For mirrors other than in Row-i ($Ry \neq i=0$ volts)

$Ax,y \neq i=|0-Rx|=(0$ or 60) volts. insufficient for actuation.

$Hx,y \neq i=|0-60|=60$ volts sufficient for holding states

It will be noted that there is no hold electrode function within Row-i in this step, since $Hx,y=i=0$ volts. Accordingly, step 258 sets (or releases previously actuated and held) the states of actuators 170 in Row-i to their required new positions and holds them in these states while voltages in step 258 are held.

Step 260 indicates a "Hold All" step in which all row and column electrodes are set to a neutral potential (e.g., 0 volts) and the storage electrodes 240 for all actuators 170 are activated or energized by storage driver 242 sufficient for holding the current states. The Hold All of step 260 may be represented by the following drive voltages:

All $Ry=0$ volts and all $Cx=0$ volts $Hxy=60$ volts

Step 262 indicates an "Increment Row" step in which counter "i" is incremented by a count of one. Step 262 returns to step 258 repeatedly until all rows are addressed (e.g., until count "i"=50). Step 262 the proceeds to step 264.

Step 264 indicates a "Repeat" step that returns to step 256.

In the exemplary implementation described above, an activation potential of greater than 114 volts between flexible arm 178 and activation electrodes 190 establishes sufficient electrostatic force to pull curled flexible arm 178 in its relaxed state toward substrate 176. As a result, dimples 202 are pulled against substrate 176 and reflector 72 lies flat, nominally at 0 degrees, in an activated, pixel ON state.

Figure 26:
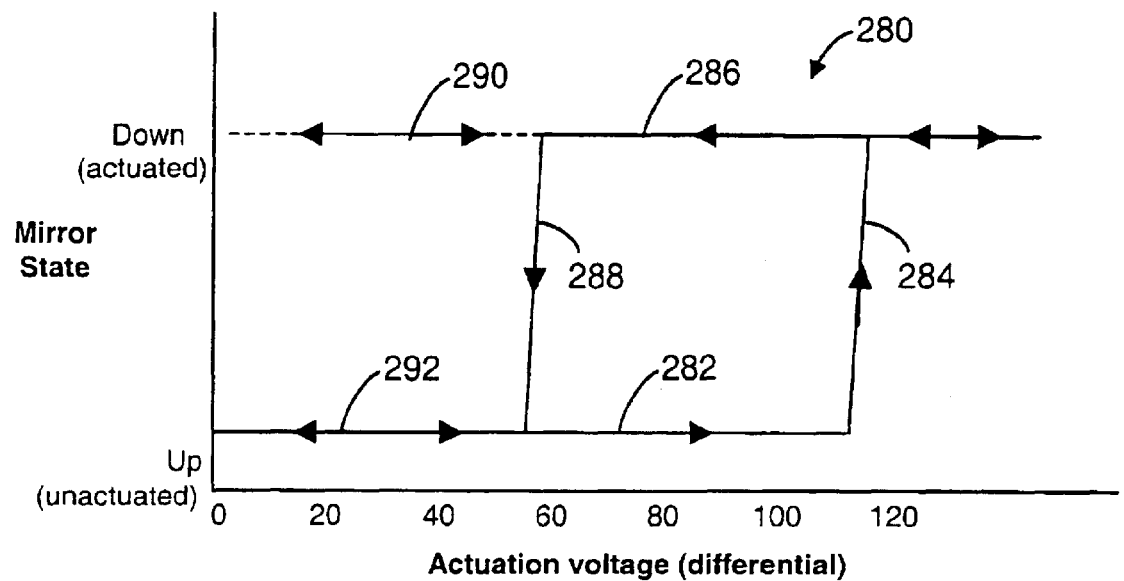
FIG. 26 is a graph illustrating hysteresis characteristics of an electrostatic bimorph MEMS actuator with respect to applied voltage differentials.

FIG. 26 is a graph 280 illustrating hysteresis characteristics of an actuator 170 with respect to applied voltage differentials. As shown in FIG. 26, actuator 170 exhibits hysteresis effects such that after activation at about 114 volts, the applied voltage differential needs to be reduced below 53 volts for actuator 170 to be released.

A bottom horizontal segment 282 illustrates that the voltage differential between activation electrodes 190 and flexible arm 178 needs to be increased above about 114 volts to move flexible arm 178 from a relaxed upward state to an activated downward state, the transition being illustrated by vertical segment 284. A top horizontal segment 286 illustrates that the voltage differential then needs to be decreased below about 53 volts to move flexible arm 178 from an activated downward state to a relaxed upward state, the transition being illustrated by vertical segment 288.

A storage activated segment 290 illustrates activation of storage electrodes 240 and shows that flexible arm 178 remains in the activated downward state even as the voltage differential between activation electrodes 190 and flexible arm 178 is reduced to below 53 volts. In the illustrated implementation, activation of storage electrodes 240 includes a voltage difference of greater than 25 volts (e.g., 60 volts) between storage electrode 240 and flexible arm 178. In contrast, a storage not-activated segment 292 illustrates absence of activation of storage electrodes 240 (e.g., 0 volt) and shows flexible arm 178 returning to its relaxed upward state when the voltage differential between activation electrodes 190 and flexible arm 178 is reduced to below 53 volts.

It will be appreciated that the hysteresis of actuator 170 allows it to be operated and held in its activated downward state without use of storage electrodes 240. Such an operation requires closer. tolerances as to the row and column drive voltages and can be more sensitive to process or manufacturing variations that may cause operation failure. Nevertheless, actuator 170 can be operated without storage electrodes 240 to provide a simpler layout and to eliminate the requirement for storage drivers.

With reference to the exemplary MUMPS manufacturing process, arm base 181 may be formed as a singly clamped cantilever of 1.5 μm thick polysilicon patterned on the Poly2 layer. Activation electrode 190 may be formed from the Poly0 layer. Dimples 202 may be formed in the Poly2 layer with Anchor1 (i.e., a hole in the 2 μm Oxide1 layer) to provide a stand-off of 2 μm, thereby to prevent the major bottom surface of flexible arm 178 from electrically contacting activation electrode 190 when actuated. Residual stress layer 182 may be formed as a 0.5 μm thick layer of gold. Reflector 72 may also be coated with gold to increase optical reflectance.

Figure 27:
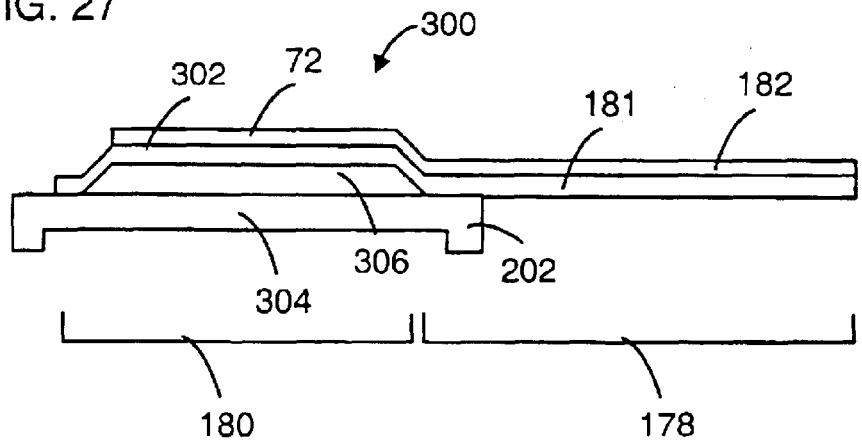
FIG. 27 is a schematic sectional side view of a mirror portion of one implementation of an electrostatic bimorph MEMS actuator having a composite structure.

Paddle end 180 of flexible arm 178 may be formed to resist the curling from residual stress characteristic of the rest of arm 178. FIG. 27 is a schematic sectional side view of one implementation paddle end 180 formed as a relatively thick composite structure 300 of, for example, a 1.5 μm thick layer 302 of Poly2 (i.e., the material of arm base 181), as well as a 2 μm thick layer 304 of Poly1 (which includes dimples 202) and a 0.75 μm thick layer 306 of trapped Oxide2 between layers 302 and 304.

Parts of the description of the preferred embodiment refer to steps of the MUMPs fabrication process described above. However, as stated, MUMPs is a general fabrication process that accommodates a wide range of MEMS device designs. Consequently, a fabrication process that is specifically designed for the present invention will likely include different steps, additional steps, different dimensions and thickness, and different materials. Such specific fabrication processes are within the ken of persons skilled in the art of photolithographic processes and are not a part of the present invention.

In view of the many possible embodiments to which the principles of our invention may be applied, it should be recognized that the detailed embodiments are illustrative only and should not be taken as limiting the scope of our invention. Rather, I claim as my invention all such embodiments as may come within the scope and spirit of the following claims and equivalents thereto.

What is claimed is:

1. A microelectrical mechanical structure (MEMS) optical display system, the system comprising:
   a source of illumination;
   a first lens to focus the illumination;
   a beam splitter to direct the illumination towards an array of MEMS devices, wherein the MEMS devices are controlled to reflect portions of the illumination back to the beam splitter, and wherein the beam splitter passes the reflected portions of illumination in a direction away from the source of illumination; and
   a display screen which displays the reflected portions of illumination;
   wherein a MEMS device is formed on a planar semiconductor substrate and comprises:
      a cantilevered flexible bimorph arm that is secured to the planar substrate, the bimorph arm being generally parallel to the planar substrate in the electrostatically activated state and extending out-of-plane from the planar substrate in the relaxed state;
      plural spaced-apart substrate electrodes secured to the substrate and positioned under and in alignment with the bimorph arm; and
      plural stand-off dimples extending between the bimorph arm and the substrate to hold the bimorph arm in spaced-apart relation to the substrate when the actuator is activated, the plural stand-off dimples being interdigitated with the plural substrate electrodes when the actuator is activated.

2. The system of claim 1, where the illumination is one of polarized and non-polarized light.

3. The system of claim 1, wherein the source of illumination is a three color light source that operates in a field-sequential manner with a MEMS device controller.

4. The system of claim 1, wherein each MEMS device corresponds to a picture element and is separately controllable.

5. The system of claim 1, further comprising a reflector to direct the illumination onto the first lens.

6. The system of claim 1, wherein the first lens is a condenser lens.

7. The system of claim 1, further comprising a lens array to focus illumination directed by the beam splitter onto an aperture array, the aperture array being in front of the array of MEMS devices.

8. The system of claim 7, wherein the aperture array allows the illumination directed by the beam splitter to become incident upon the array of MEMS devices.

9. The system of claim 8, wherein the aperture passes illumination reflected by a MEMS device when the MEMS device is at rest and blocks illumination reflected by a MEMS device when the MEMS device is activated.

10. A display engine for selectively modulating light from an illumination source, the engine comprising:
   a MEMS reflective modulator assembly, the modulator assembly comprising:
      an array of MEMS devices, each device having formed on one or more planar semiconductor substrates, each device comprising:
         a cantilevered flexible bimorph arm that is secured to the planar substrate, the bimorph arm being generally parallel to the planar substrate in the electrostatically activated state and extending out-of-plane from the planar substrate in the relaxed state;
         plural spaced-apart substrate electrodes secured to the substrate and positioned under and in alignment with the bimorph arm; and
         plural stand-off dimples extending between the bimorph arm and the substrate to hold the bimorph arm in spaced-apart relation to the substrate when the actuator is activated, the plural stand-off dimples being interdigitated with the plural substrate electrodes when the actuator is activated; and
      means for control of the array;
   an aperture plate positioned such that illumination passes through before being reflected by a MEMS device; and
   a lens array to focus illumination onto the array of MEMS devices.

11. The engine of claim 10, wherein the lens array is formed of one of molded plastic, holographic lenses, and conventional glass lenses.

12. The engine of claim 10, wherein each MEMS corresponds to a picture element and is separately controllable using the control means.

* * * * *